United States Patent [19]

Lin

[11] Patent Number: 4,476,401
[45] Date of Patent: Oct. 9, 1984

[54] WRITE STROBE GENERATOR FOR CLOCK SYNCHRONIZED MEMORY

[75] Inventor: Liang-Tsai Lin, Scottsdale, Ariz.

[73] Assignee: Motorola, Inc., Schaumburg, Ill.

[21] Appl. No.: 462,574

[22] Filed: Jan. 31, 1983

[51] Int. Cl.³ .......................... H03K 3/86; H03K 5/06
[52] U.S. Cl. .................................... 307/269; 307/268;
307/247 R; 307/262; 307/585; 307/601;
307/602; 307/605; 328/55; 328/61
[58] Field of Search .................... 328/55, 61; 307/262,
307/268, 269, 585, 601, 602, 605, 247 R

[56] References Cited

U.S. PATENT DOCUMENTS

| | | | |
|---|---|---|---|
| 3,391,389 | 7/1968 | Cruger et al. | 307/273 |
| 3,443,232 | 5/1969 | Stinson | 307/268 |
| 3,473,129 | 10/1969 | Tschannen | 307/262 |
| 3,493,884 | 2/1970 | Kulp | 307/262 |
| 3,504,288 | 3/1970 | Ross | 328/61 |
| 4,105,980 | 8/1978 | Cowardin et al. | 328/55 |

Primary Examiner—John S. Heyman
Attorney, Agent, or Firm—Vincent B. Ingrassia

[57] ABSTRACT

An on-chip memory control circuit generates a proper WRITE STROBE signal for a clock synchronized pipe-line operated integrated circuit memory. A symmetrical clock signal having half the frequency of the system clock is produced by applying the system clock to the C input of a standard master slave delay type flip-flop having its $\bar{Q}$ output fed back to its D input. A negative going pulse train $\phi_P$ comprising a pulse at every transition of the symmetrical clock is generated by a level change detector which issues a pulse of a desired width whenever a level change at its input is detected. A delayed pulse train $\phi_{PD}$ is produced by delaying $\phi_P$ an amount which depends on the speed of the memory and other design criteria. The pulse drains $\phi_P$ and $\phi_{PD}$ are applied to an asynchronous flip-flop, the output of which corresponds to the desired WRITE STROBE signal.

10 Claims, 3 Drawing Figures

WRITE STROBE GENERATOR FOR CLOCK SYNCHRONIZED MEMORY

BACKGROUND OF THE INVENTION

This invention relates generally to memory control circuits and, more particularly, to an on chip WRITE STROBE signal generator utilizing a unique level detector in combination with standard logic elements.

It is well known that for clock synchronized, pipeline operated memories, a properly timed WRITE STROBE signal must be generated so as to avoid writing information into erroneous locations of memory. In the past, however, such signals have been generated off-chip (i.e. external to the integrated circuit chip on which the memory is impemented) in accordance with the memory's write enable timing specification. To make clock synchronized memories easier to use and to free the user from the awkward task of providing the appropriate WRITE STROBE signal, it would be desirable to provide circuitry on the memory chip itself which will produce the required signal solely from the system clock regardless of the frequency and duty cycle of the clock.

SUMMARY OF THE INVENTION

It is an object of the present invention to provide an on-chip circuit which generates a WRITE STROBE signal for controlling the writing of information into memory.

It is a further object of the present invention to provide an on-chip memory control circuit for generating a correct WRITE STROBE signal regardless of the frequency or duty cycle of the system clock.

It is a still further object of the present invention to provide an on-chip memory control circuit for generating a proper WRITE STROBE signal which receives the system clock as its only input.

According to a broad aspect of the invention there is provided a circuit for generating a plurality of output pulses each in response to one of a plurality of input pulses and occurring at a predetermined period of time thereafter, comprising first means for receiving said plurality of input pulses and generating therefrom a symmetrical pulse train having a reduced frequency; second means coupled to said first means for generating a trigger pulse of a first predetermined duration at every transition of said symmetrical pulse train; third means coupled to said second means for delaying said trigger pulses; and switching means coupled to said second and third means for receiving therefrom said trigger pulses and the delayed trigger pulses and for generating therefrom said plurality of output pulses.

According to a further aspect of the invention there is provided an on-chip memory control circuit for use on a clock synchronized integrated circuit memory chip for generating a WRITE STROBE signal at a predetermined period of time after the occurrence of an input clock signal comprising a train of clock pulses, comprising first means for receiving said clock pulses and generating therefrom a symmetrical clock signal having a reduced frequency; second means coupled to said first means for generating a trigger pulse of a first predetermined duration at every transition of said symmetrical clock signal; third means coupled to said second means for delaying said trigger pulses; and switching means coupled to said second and third means for receiving therefrom said trigger pulses and the delayed trigger pulses respectively and for generating therefrom said WRITE STROBE signal.

The above and other objects, features and advantages of the present invention will be more clearly understood from the following detailed description taken in conjunction with the accompanying drawings, in which:

DESCRIPTION OF THE PREFERRED EMBODIMENT

Figure 1:
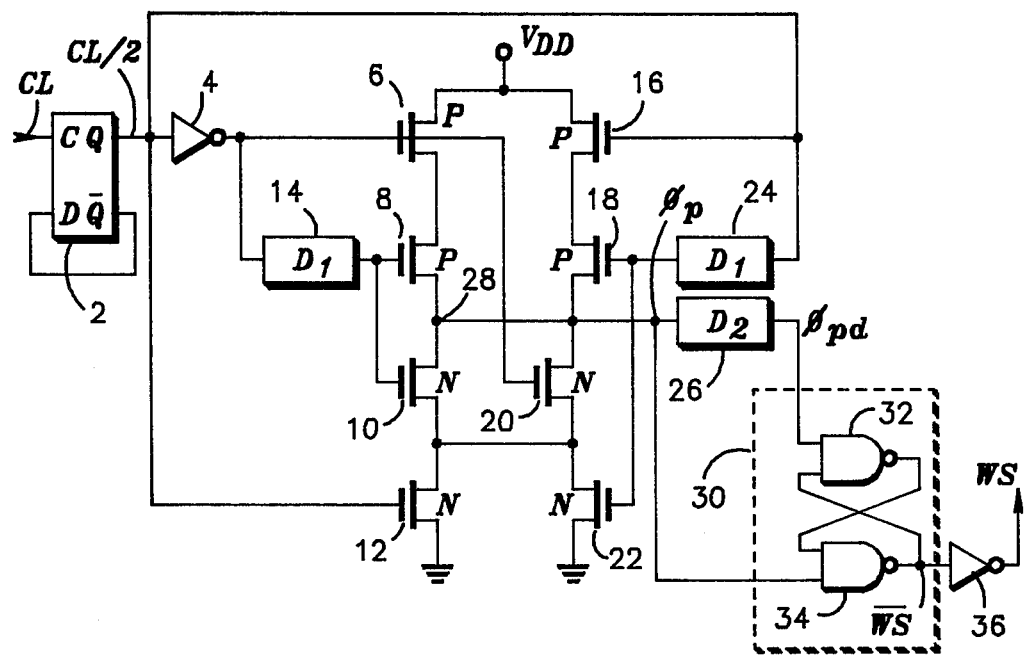
FIG. 1 is a schematic diagram of the inventive WRITE STROBE generation circuit.

Referring to FIG. 1, the system clock (CL) is applied to a first input (c) of a delay type flip-flop 2 having Q and $\overline{Q}$ outputs. The $\overline{Q}$ output is fed back to the delay input such that the flip-flop will change states each time the leading edge of the clock pulse appear at the (c) input. Thus, the signal at the Q output of delay flip-flop 2 (CL/2) is a symmetrical pulse train having a frequency one half that of the system clock. The system clock (CL) and the divided system clock (CL/2) are shown in lines A and B respectively of FIG. 3.

The Q output of delay flip-flop 2 is applied to the input of a level shift detector which comprises inverter 4, P-type field effect transistors 6, 8, 16, and 18, N-type field effect transistors 10, 12, 20, and 22, and delays 14 and 24 each of which imparts a delay $D_1$ to the signal which appears at its input. The Q output of delay flip-flop 2 is applied to the input of inverter 4, to the gate of transistor 12, to the gate of transistor 16, and to the input of delay 24. The output of inverter 4 is applied to the gate of transistor 6, to the gate of transistor 20, and to the input of delay 14. The output of delay 14 is coupled to the gates of transistors 8 and 10, and the output of delay 24 is coupled to the gates of transistors 18 and 22. The drain electrodes of transistors 6 and 16 are coupled to a source of supply voltage ($V_{DD}$) while their sources are coupled respectively to the drain electrodes of transistors 8 and 18. The source electrodes of transistors 8 and 18 are coupled respectively to the drain electrodes of transistors 10 and 20 which are in turn coupled together. The source electrodes of transistors 12 and 22 are each coupled to a second source of supply voltage (ground) and their drain electrodes are coupled together and to the source electrodes of transistors 10 and 20.

The output ($\phi p$) of the level shift detector which appears at node 28 (shown in line C of FIG. 3) is applied to the input of delay 26 and to a first input of asynchronous flip-flop 30. Delay 26 immparts a delay $D_2$ to $\phi p$ to provide a signal $\phi_{PD}$ which is applied to a second input of asynchronous flip-flop 30. Asynchronous flip-flops are well known to those skilled in the art and may comprise first and second NAND gates 32 and 34 each having an output which is connected to the second input of the other. The desired WRITE STROBE signal appears in an inverted form at the output of NAND gate 34 (shown in line E of FIG. 3) and is applied to the input of inverter 36. WRITE STROBE signal (WS) appears at the output of inverter 36 and is shown in line F of FIG. 3.

Figure 2:
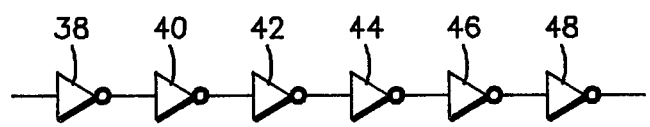
FIG. 2 is a schematic diagram illustrating how the delay circuits of FIG. 1 may be implemented.

Before describing the operation of the circuit shown at FIG. 1, it should be clear that the delay units 14, 24, and 26 may be implemented in a variety of ways which are well known to those skilled in the art. One such approach is shown in FIG. 2 wherein the delay is implemented by a series of inverter gates 38, 40, 42, 44, 46 and 48. That is, the signal appearing at the input of inverter 38 will appear in a delayed form at the output of inverter 48, the amount of delay being determined by the propagation delay of each inverter and the number of inverters used in the chain. It should be clear that the length of the delays are a matter of design choice. One need only insure that an even number of series coupled inverter gates be employed in each delay string to avoid an unwanted signal inversion. For the purposes of the circuit shown in FIG. 1, delays 14 and 24 each in part a substantially identical delay D1 and may, for example, be produced through the use of six series inverters. Delay D2 may be produced by a series of eight inverters.

Figure 3:
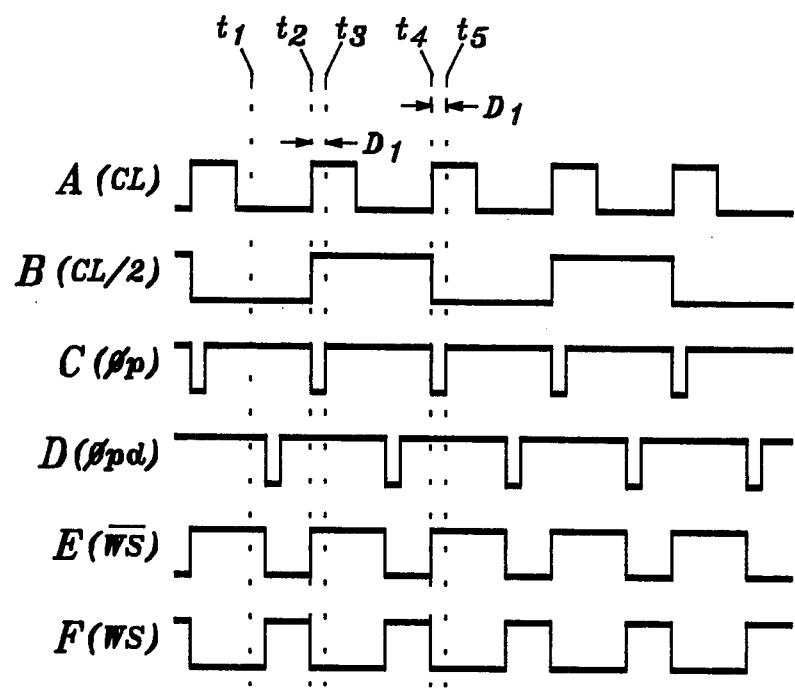
FIG. 3 is a timing diagram illustrating various waveforms as they appear during the operation of the circuit of FIG. 1.

The operation of the circuit will now be described in conjunction with FIGS. 1 and 3. The reader is reminded that an N channel field effect transistor will be turned on when a logical high voltage appears at its gate electrode, while a P-channel field effect transistor will be turned on when a logical low voltage appears at its gate electrode. With the above in mind, the discussion of operation shall begin at a point and time $t_1$ (shown in FIG. 3) which trails the trailing edge of the divided clock (CL/2) by an amount which exceeds the delay ($D_1$) imparted by delays 14 and 24. At this point and time ($t_1$), transistors 6, 8, 12 and 22 are off and transistors 10, 16, 18 and 20 are on. Thus, transistors 16 and 18 supply current to node 28 causing the voltage thereat to rise since there is no path to ground (i.e. transistors 12 and 22 are off). Thus, $\phi p$ at time $t_1$ is a logical high.

When the divided clock signal (CL/2) rises at time $t_2$, transistors 6 and 12 turn on while transistors 16 and 20 turn off. The states of transistors 8, 10, 18 and 22 remain unchanged due to the delaying action of delays 14 and 24. Now, since both transistors 10 and 12 are on, there is a completed path to ground from node 28 and therefore $\phi p$ will go low. Furthermore, since transistor 16 is off, there is no current supplied to node 28.

After a period of time corresponding to delay $D_1$ has elapsed (time $t_3$ in FIG. 3) transistors 8 and 22 will turn on and transistors 10 and 18 will turn off. In this case, with transistors 6 and 8 on, current is supplied to node 28. However, since transistors 10 and 20 are off, there is no path to ground and the voltage at node 28 ($\phi p$) rises to a logical high voltage.

When a divided clock signal (CL/2) again goes low ($t_4$), transistors 6 and 12 turn off and transistors 16 and 20 turn on. In this case, transistors 20 and 22 supply a path to ground causing the voltage at node 28 ($\phi p$) to drop to a logical low value. Since transistor 6 is off no current is supplied to node 28.

Finally, after a period of time equivalent to $D_1$ (i.e. at $t_5$), transistors 8 and 22 turn off and transistors 10 and 18 turn on. Transistors 16 and 18 supply current to node 28 causing the voltage to rise again since there is no path to ground (i.e. transistors 12 and 22 are off).

The output signal $\phi p$ (line c of FIG. 3) is applied to a first input of asynchronous flip-flop 34 and to the input of a delay 26. The output of delay 26 ($\phi_{PD}$) is shown in line D of FIG. 3 and is applied to a second input of asynchronous flip-flop 30. Delay 26 immparts a delay $D_2$ and may be implemented in a manner similar to that shown in FIG. 2. The output of asynchronous flip-flop 30 ($\overline{WS}$) appears at the output of NAND gate 34 and is shown in line E of FIG. 3. As can be seen, this output goes high on the trailing edge of $\phi p$ and goes low on the trailing edge of $\phi_{PD}$. The desired WRITE STROBE signal (WS) appears at the output of inverter gate 36 and is shown in line F of FIG. 3. As can be seen, the WRITE STROBE signal pulses occur at a time sufficiently delayed from the system clock so as to permit the address bits to settle down and avoid writing information into erroneous locations and memory.

In summary, the desired WRITE STROBE signal is produced by generating a symmetrical clock with half the frequency of the system clock (CL/2) by feeding the system clock (CL) into the C input of a standard master slave delay type flip-flop having its $\overline{Q}$ output fed back to its D input. Next, a negative going pulse train $\phi p$ is generated which includes a negative going pulse at every transition of the divided clock (CL/2). This is accomplished by applying CL/2 to a level change detector which generates a pulse of a desired width whenever a level change at its input is detected. Next, a delayed pulse train $\phi_{PD}$ is produced from $\phi p$. The amount of delay is a design choice and depends upon the speed of the memory. Finally, $\phi p$ and $\phi_{PD}$ are applied to the clear and set inputs respectively of an asynchronous flip-flop. The output of the flip-flop is inverted to produce the desired WRITE STROBE signal.

The above description is given by way of example only. Changes in form and details may be made by one skilled in the art without departing from the scope of the invention.

I claim:

1. A circuit for generating a plurality of output pulses, each in response to one of a plurality of input pulses and occurring at a predetermined period of time thereafter, comprising:
   first means for receiving said plurality of input pulses and generating therefrom a symmetrical pulse train having a reduced frequency;
   second means coupled to said first means for generating a trigger pulse of a first predetermined duration at every transition of said symmetrical pulse train, said second means including first delay means having a delay time corresponding to said first predetermined duration;
   third means coupled to said second means for delaying each of said trigger pulses; and
   switching means coupled to said second and third means for receiving therefrom said trigger pulses and the delayed trigger pulses and for generating therefrom said plurality of output pulses.

2. A circuit according to claim 1 wherein said second means comprises a level change detector which receives said symmetrical pulse train and issues in response thereto a pulse of said first predetermined duration whenever a level change in said symmetrical pulse train is detected.

3. A circuit according to claim 2 wherein said level change detector comprises:
   a first inverter having an input coupled to receive said symmetrical pulse train and having an output;
   first delay means having an input coupled to the output of said first inverter and having an output;
   second delay means having an input coupled to receive said symmetrical pulse train and having an output;

a first P-channel field effect transistor having a drain adapted to be coupled to a first source of supply voltage, a gate coupled to the output of said first inverter and having a source;

a second P-channel field effect transistor having a drain coupled to the source of said first P-channel field effect transistor, a gate coupled to the output of said first delay means, and having a source;

a first N-channel field effect transistor having a drain coupled to the source of said second P-channel field effect transistor, a gate coupled to the output of said first delay means, and having a source;

a second N-channel field effect transistor having a drain coupled to the source of said first N-channel field effect transistor, a gate coupled to receive said symmetrical pulse train, and a source adapted to be coupled to a second source of supply voltage;

a third P-channel field effect transistor having a drain adapted to be coupled to said first source of supply voltage, a gate coupled to receive said symmetrical pulse drain, and having a source;

a fourth P-channel field effect transistor having a drain coupled to the source of said third P-channel field effect transistor, a gate coupled to the output of said second delay means and having a source;

a third N-channel field effect transistor having a drain coupled to the source of said fourth P-channel field effect transistor and to the source drain junction of said second P-channel field effect transistor and said first N-channel field effect transistor, a gate coupled to the output of said first inverter and a source coupled to the source-drain junction of said first and second N-channel field effect transistor; and a fourth N-channel field effect transistor having a drain coupled to the source of said third N-channel field effect transistor, a gate coupled to the output of said second delay means and a source adapted to be coupled to said second source of supply voltage, said trigger pulses appearing at the source-drain junction of said second P-channel field effect transistor and said first N-channel field effect transistor and at the source-drain junction of said fourth P-channel field effect transistor and said third N-channel field effect transistor.

4. Circuit according to claim 2 wherein said first means comprises a flip-flop for generating said pulse train having half the frequency of said input pulses.

5. A circuit according to claim 4 wherein said flip-flop is a delay flip-flop having its $\overline{Q}$ output coupled to its D input.

6. A circuit according to claim 4 wherein said trigger pulses are negative going pulses having a width corresponding to the delay imparted by said first delay means.

7. A circuit according to claim 4 wherein said switching means comprises an asynchronous flip-flop having a first input coupled to receive said trigger pulses and a second input coupled to receive the delayed trigger pulses.

8. An on-chip memory control circuit for use in a clock synchronized integrated circuit memory chip for generating a WRITE STROBE signal at a predetermined period of time after the occurance of an input clock signal comprising a train of clock pulses, comprising:

first means for receiving said clock pulses and generating therefrom a symmetrical clock signal having a reduced frequency;

second means coupled to said first means for generating a trigger pulse of a first predetermined duration at every transition of said symmetrical clock signals, said second means including first delay means having a delay time corresponding to said first predetermined duration;

third means coupled to said second means for delaying each of said trigger pulses; and switching means coupled to said second and third means for receiving therefrom said trigger pulses and the delayed trigger pulses respectively and for generating therefrom said WRITE STROBE signal.

9. A circuit according to claim 8 wherein said second means comprises a level change detector which issues a trigger pulse at every transition of said symmetrical clock signal.

10. A circuit according to claim 9 wherein said first means comprises a flip-flop for reducing the frequency of said clock signal by a factor of two.

* * * * *